United States Patent

Nikutta et al.

[11] Patent Number: 5,821,804
[45] Date of Patent: Oct. 13, 1998

[54] INTEGRATED SEMICONDUCTOR CIRCUIT

[75] Inventors: Wolfgang Nikutta, Munich; Werner Reczek, Ottobrunn, both of Germany

[73] Assignee: Siemens Aktiengesellschaft, Munich, Germany

[21] Appl. No.: 629,184

[22] Filed: Apr. 8, 1996

[30] Foreign Application Priority Data

Apr. 6, 1995 [EP] European Pat. Off. .............. 95105212

[51] Int. Cl.⁶ ...................................................... H03K 5/08
[52] U.S. Cl. .......................... 327/382; 327/381; 327/534; 257/360; 361/90; 361/91
[58] Field of Search ..................... 327/534, 381, 327/382, 551; 257/358, 360, 363; 361/58, 90, 91

[56] References Cited

U.S. PATENT DOCUMENTS

| | | | |
|---|---|---|---|
| 5,079,612 | 1/1992 | Takamoto et al. | 357/41 |
| 5,426,323 | 6/1995 | Reczek et al. | 257/360 |
| 5,521,415 | 5/1996 | Kondo | 257/357 |
| 5,581,104 | 12/1996 | Lowrey et al. | 257/355 |
| 5,646,434 | 7/1997 | Chrisostomides et al. | 257/355 |

FOREIGN PATENT DOCUMENTS 0 623 958 A1   9/1994   European Pat. Off. .

OTHER PUBLICATIONS

Japanese Patent Abstract No. 6069454 (Yoshiyuki), dated Nov. 3, 1994, Semiconductor Storage Device.
Japanese Patent Abstract No. 5299598 (Terutaka), dated Dec. 11, 1993, Semiconductor Device.
Japanese Patent Abstract No. 3156965 (Tomonobu), dated Apr. 7, 1991, Semiconductor Integrated Circuit Device.

*Primary Examiner*—Timothy P. Callahan
*Assistant Examiner*—Jung Ho Kim
*Attorney, Agent, or Firm*—Herbert L. Lerner; Laurence A. Greenberg

[57] ABSTRACT

An integrated semiconductor circuit includes a semiconductor substrate. A number of first potential buses carry a first supply potential of the semiconductor circuit during operation. A number of second potential buses carry a second supply potential of the semiconductor circuit during operation. A number of circuit portions formed on the substrate are each connected between one of the first and one of the second potential buses for being supplied with electrical voltage. Connection points are formed on the substrate and are each assigned to one of the circuit portions for receiving an input or output signal for the circuit portion during operation of the circuit portion. Protective circuits are formed on the substrate and are each assigned to one of the circuit portions for preventing overvoltage. The protective circuits each have an input side connected to one of the connection points and an output side connected to the circuit portion. A common potential bus bar carries a reference potential being common with respect to all of the connection points during operation. The protective circuits have discharge paths coupled with the potential bus bar for dissipating overvoltages.

8 Claims, 4 Drawing Sheets

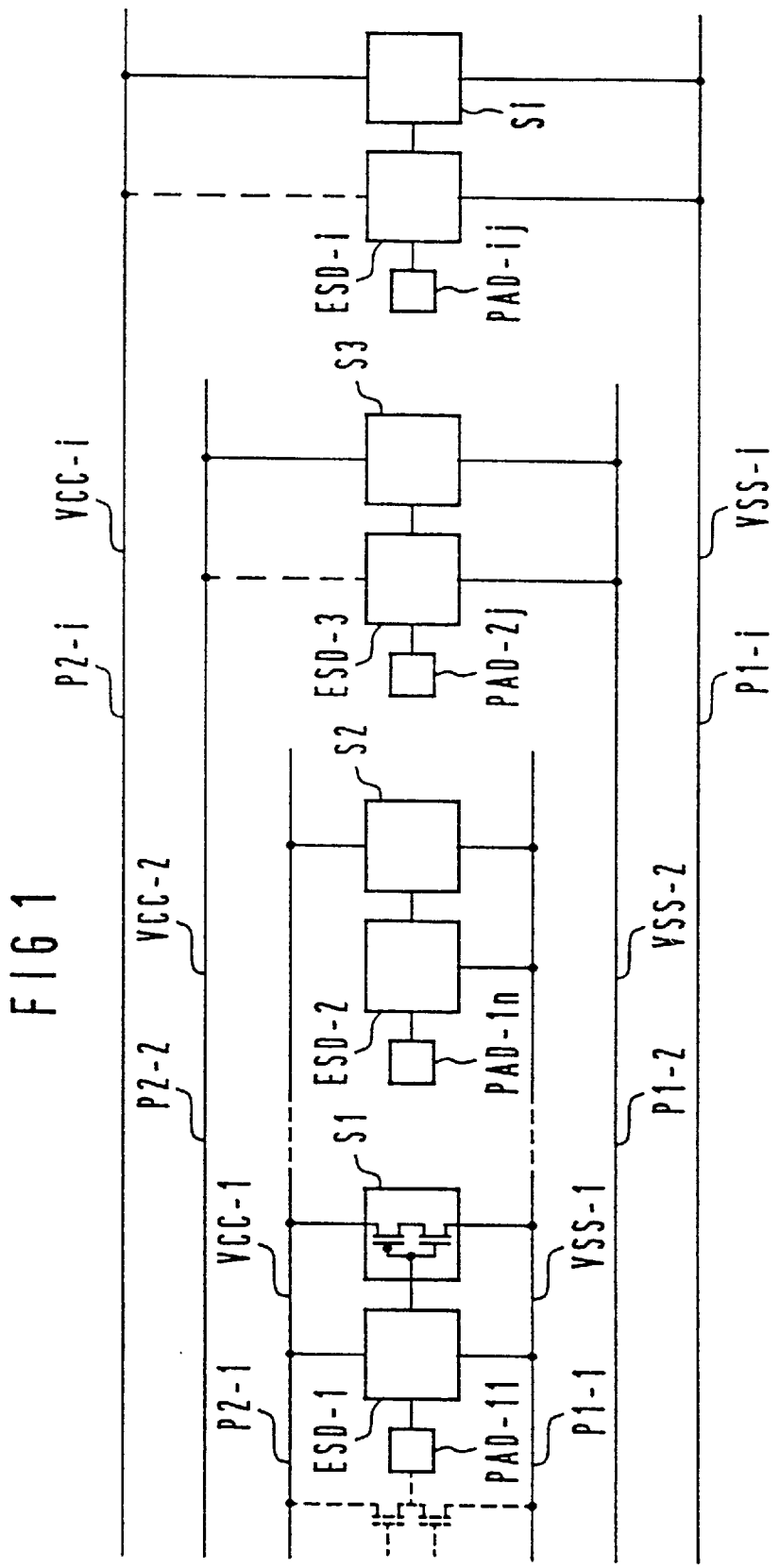

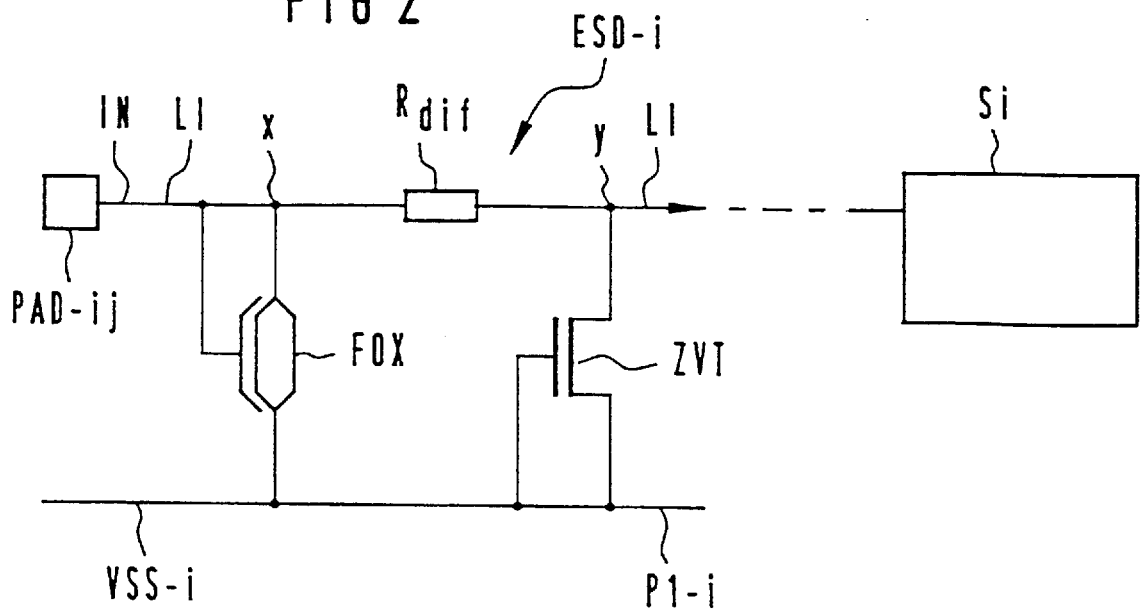
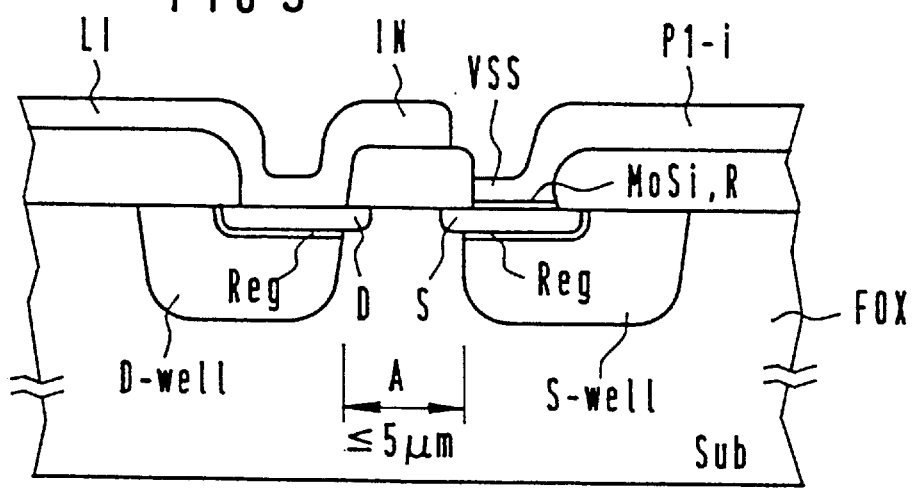

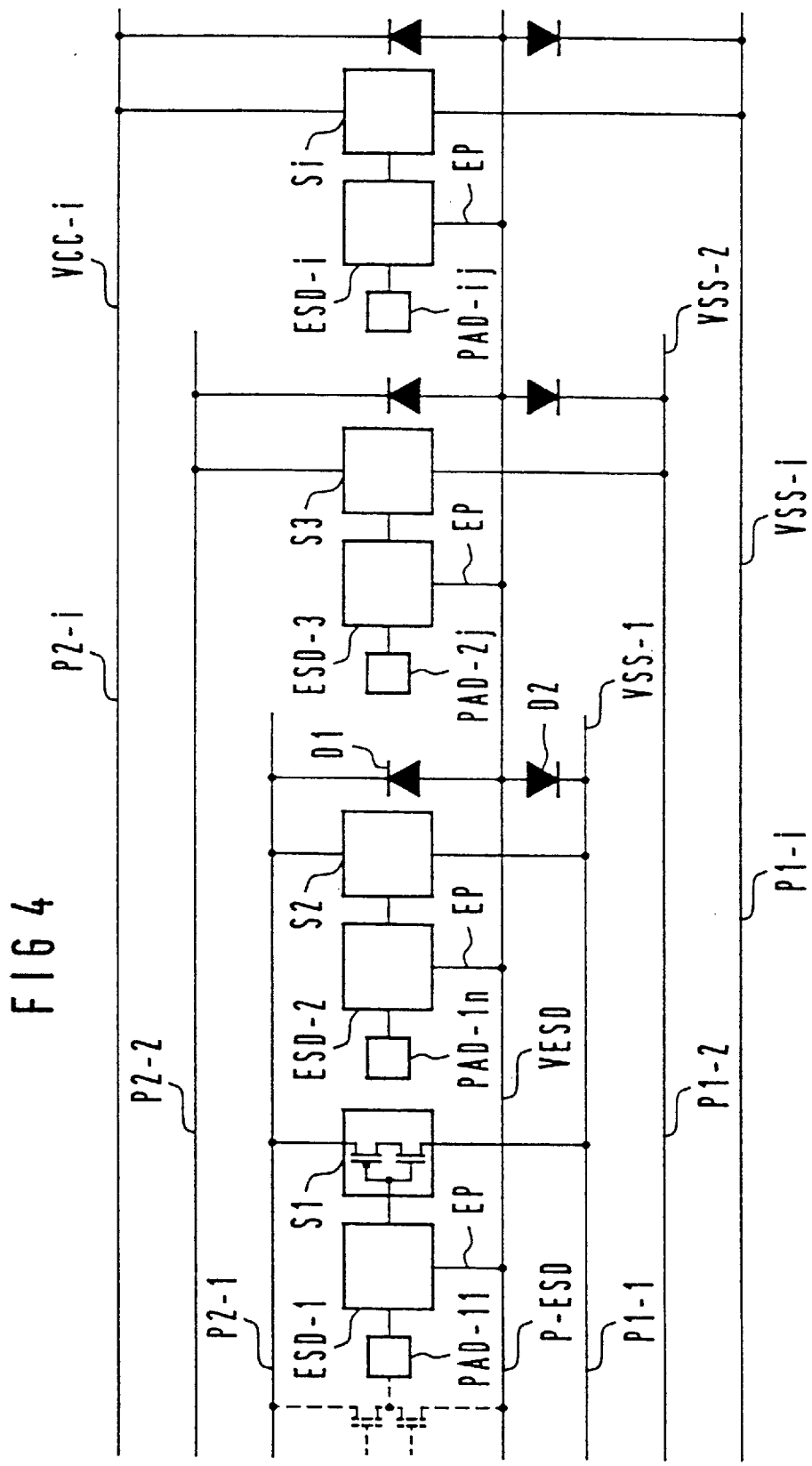

INTEGRATED SEMICONDUCTOR CIRCUIT

BACKGROUND OF THE INVENTION

FIELD OF THE INVENTION

The invention relates to an integrated semiconductor circuit having a semiconductor substrate, a number of first potential buses which carry a first supply potential of the semiconductor circuit during operation, a number of second potential buses which carry a second supply potential of the semiconductor circuit during operation, a number of circuit portions which are formed on the semiconductor substrate and which are each connected between one of the first and one of the second potential buses for being supplied with electrical voltage, connection points which are formed on the semiconductor substrate and are each assigned to a circuit portion, an input or output signal for the respective circuit portion is applied to the connection points during operation of the circuit portion, and protective circuits which are assigned to the circuit portions and are formed on the semiconductor substrate to prevent overvoltage, the protective circuits are connected on the input side to the associated connection point of the respective circuit portion and are connected on the output side to the respective circuit portion.

One such integrated semiconductor circuit is known, for instance, from Published European Patent Application 0 623 958 A1, corresponding to U.S. Pat. No. 5,426,323. Integrated semiconductor circuits, especially MOS-integrated semiconductor circuits, are known to be vulnerable to electrostatic discharges (ESD=electrostatic discharge), to the extent that the discharges affect their terminals (PADs on the semiconductor chip and pins on the semiconductor circuit housing). In order to avoid ESD damage, the known integrated semiconductor circuit has protective circuits for dissipating overvoltages, which are formed on the semiconductor substrate and are each disposed between a connection point (PAD) and a circuit portion associated with the corresponding connection point. The protective circuits are connected either to a first supply potential VSS (typically, ground) or, more seldom, to a second supply potential VCC. For layout reasons, that is because there is only limited space available, such ESD protective circuits are connected only to the particular local supply potential in the immediate vicinity of the associated circuit portion, which as a rule is the local first supply potential VSS.

The known configuration of an integrated semiconductor circuit with ESD protective circuits and multiple supply voltage terminals is described in greater detail below with regard to FIG. 1.

For further details, characteristics and advantages of the ESD protective circuit, reference is expressly made to Published European Patent Application 0 623 958 A1, corresponding to U.S. Pat. No. 5,426,323, filed by the present applicant, and its contents are hereby entirely incorporated by reference.

SUMMARY OF THE INVENTION

It is accordingly an object of the invention to provide an integrated semiconductor circuit, which overcomes the hereinafore-mentioned disadvantages of the heretofore-known devices of this general type, in such a way that it can meet even more-stringent demands for ESD protection, and in particular that crosswise ESD loads can be effectively avoided without increasing the amount of space required for ESD protective circuits.

With the foregoing and other objects in view there is provided, in accordance with the invention, an integrated semiconductor circuit, comprising a semiconductor substrate; a number of first potential buses carrying a first supply potential of the semiconductor circuit during operation; a number of second potential buses carrying a second supply potential of the semiconductor circuit during operation; a number of circuit portions being formed on said semiconductor substrate and each being connected between a respective one of said first and a respective one of said second potential buses for being supplied with electrical voltage; connection points being formed on said semiconductor substrate and each being assigned to a respective one of said circuit portions for receiving an input or output signal for said respective circuit portion during operation of said circuit portion; protective circuits being formed on said semiconductor substrate and each being assigned to a respective one of said circuit portions for preventing overvoltage, said protective circuits each having an input side being connected to a respective one of said connection points and an output side being connected to said respective circuit portion; and a common potential bus bar carrying a reference potential being common with respect to all of said connection points during operation; said protective circuits having discharge paths being coupled with said common potential bus bar for dissipating overvoltages.

According to the principle of the invention, the ESD protective circuit is thus connected between the associated connection point PAD of the circuit portion and a potential bus that is common for all of the PADs. In this way, all conceivable ESD load situations are disposed symmetrically with respect to an arbitrary supply potential. In all cases, the ESD discharge current flows by way of the protective structure diode conduction path of the common potential bus bar. In this way, an ESD load on the substrate diodes can be effectively prevented, without having to provide a space-intensive or hogging and complicated protective circuit or protective structure.

The potential bus bar may be a line which is constructed entirely independently on the semiconductor substrate. Therefore, in accordance with another feature of the invention, the potential bus bar forms a common potential bar that is formed in any case on the semiconductor substrate and which carries a potential that is common for all of the circuit portions, during operation of the semiconductor circuit.

The selection of the common potential bar which is suitable for this purpose depends on the existing protective structures and the electrical specifications of the connected pins. The protective structure (ESD) which is chosen depends on the available technology and on the chip specifications. In CMOS processes, field oxide transistors, bipolar transistors or bipolar diodes would be appropriate. The effectiveness of the protective structure increases with a lower breakdown voltage and high current-carrying capacity. Parasitic pn diodes, which as a rule are present at the proportionally large-area supply terminals, are adequate as the bipolar diodes. Additional pn diodes which are already planned as a semiconductor device in the planning stage, as a rule have a higher loadability.

In accordance with a further feature of the invention, particularly when used in a dynamic semiconductor memory device of the CMOS type, the potential ring for the substrate voltage or bulk voltage of the semiconductor circuit is especially preferably chosen as the potential bus bar. This has the additional advantage of ensuring that the protective structure of the parasitic substrate diode is connected in parallel and directly prevents substrate breakdowns. The protective structure then is an npn bipolar transistor and the pn diode is built in as a component in the chip structure.

In accordance with an added feature of the invention, there is provided at least one pair of two anti-parallel-connected diode devices connecting said common potential bus bar to a respective one of said first potential buses and a respective one of said second potential buses connected to a respective one of said circuit portions.

In accordance with an additional feature of the invention, there are provided lines each being coupled with a respective one of said connection points, said protective circuits each having a field oxide transistor being formed in said semiconductor substrate and having a gate terminal connected to a respective one of said lines.

In accordance with yet another feature of the invention, there are provided field-controlled diodes each being connected downstream of a respective one of said field oxide transistors formed in said semiconductor substrate, said field-controlled diodes each having one terminal connected to a respective one of said lines and the another terminal connected to a respective one of said first potential buses.

In accordance with yet a further feature of the invention, the field-controlled diodes are zero volt transistors.

In accordance with a concomitant feature of the invention, the field oxide transistors each have another terminal connected to said line, and there are provided diffusion resistors each being connected to said line between a respective one of said field-controlled diodes and said terminals of a respective one of said field oxide transistors.

Other features which are considered as characteristic for the invention are set forth in the appended claims.

Although the invention is illustrated and described herein as embodied in an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic and block circuit diagram of a configuration of ESD protective circuits in a known integrated semiconductor circuit;

FIG. 2 is a schematic and block circuit diagram of an ESD protective circuit;

FIG. 3 is a diagrammatic, sectional view of a portion of the integrated semiconductor circuit having one circuit portion and the ESD protective circuit associated with that circuit portion;

FIG. 4 is a schematic and block circuit diagram of a configuration of an integrated semiconductor circuit according to the invention having multiple supply voltage terminals.

DESCRIPTION OF THE PREFERRED EMBODIMENTS

Figure 5:
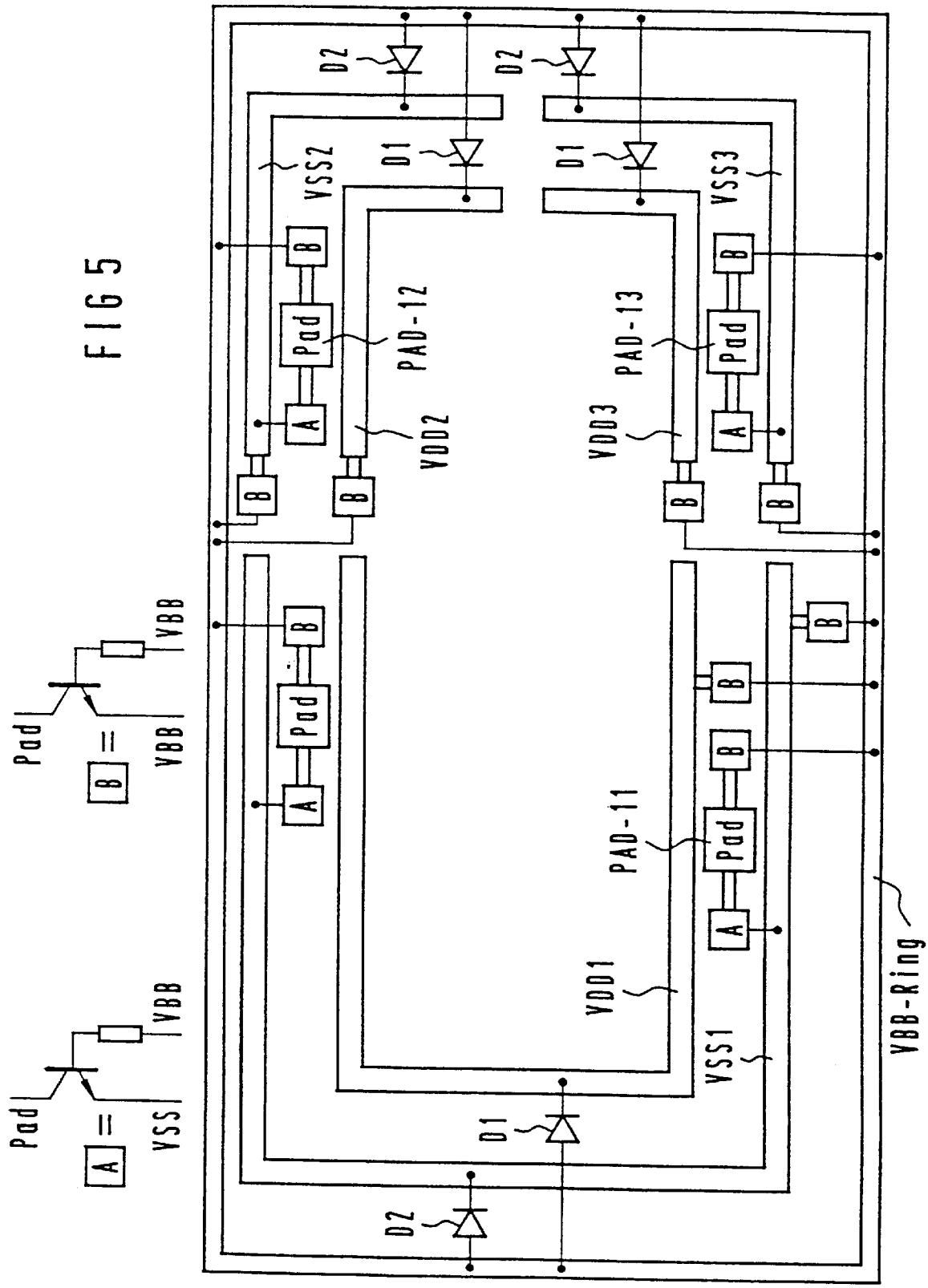
FIG. 5 is a plan view of a schematic and block circuit diagram of the configuration of an integrated semiconductor circuit according to the invention.

Referring now to the figures of the drawings in detail and first, particularly, to FIG. 1 thereof, there is seen a known configuration of an integrated semiconductor circuit with ESD protective circuits and multiple supply voltage terminals. A number of first potential buses P1-1, P1-2, ..., P1-i, which are insulated from one another in the component and which, during operation, carry a first supply potential VSS-1, VSS-2, ..., VSS-i, and a number of second potential buses P2-1, P2-2, ..., P2-i, which are likewise insulated from one another in the component and which, during operation, carry a second supply potential VCC-1, VCC-2, ..., VCC-i of the semiconductor circuit, are provided. The reason for the potential buses for the voltage supply being internally separate is that such noise sources as interference in an input buffer from current peaks are decoupled out of I/O drivers. A number of circuit portions S1, S2, S3, ..., Si that are also provided are formed on the semiconductor substrate and are each connected between one of the first and one of the second potential buses, in order to be supplied with electrical voltage. In order to protect the circuit portions Si against overvoltages from an ESD load, protective circuits ESD-1, ESD-2, ESD-3, ..., ESD-i are each disposed in a line path between a connection point PAD-11, PAD-1n, PAD-2j, PAD-ij and an associated circuit portion S1, S2, S3, ..., Si and are coupled with the associated local first potential bus P1-1, P1-2, ..., P1-i.

The use of the index letter in the instant application will now be explained. The index letter i stands for the number of voltage supplies of the integrated semiconductor circuit. For instance, a 256K×16 DRAM has three separate voltage supplies (i=3), that is three VCC pins and three VSS pins, which as a rule are insulated from one another in the component. The symbol PAD-kj stands for a connection point or PAD with the sequential number j at the voltage supply k (1<k<i). Thus a PAD-37, for instance, designates a connection point (PAD) with the sequential number 7, which is connected by its protective structure to a voltage supply VSS-3 and/or VCC-3.

In the previously known integrated semiconductor circuit having a plurality of voltage supplies, there are in particular two types of critical ESD load situations, which can be characterized by the MIL standard.

One type involves an ESD load situation of PAD to voltage supply. In the case where i≠k, an ESD load of the connection point PAD-jk to the voltage supply VCC-i or VSS-i is involved. This means that the local ESD protective structure at PAD-kj is not connected to VCC-i or VSS-i and can thus not become electrically operative. In that case, the ESD discharge will therefore take place through other active structures (gate oxides, pn diodes), which can be destroyed in the process. The ESD load of the connection point PAD-ij to the local voltage supply VCC-i or VSS-i, which load is present in the case where i=k, is not critical, since the ESD protective structure is active in the discharge path.

The second type of critical ESD load situation relates to an ESD load of PAD to PAD. In the case where i=k, there is a load from PAD-kj to PAD-km (connection points on a common VCC-k or VSS-k bar). In the known integrated semiconductor circuit, an ESD discharge that takes place over the path can be defined as PAD-kj–ESD–VCC-k or VSS-k–ESD–PAD-km. In other words, the two ESD protective structures are connected in series. In the case where i≠k, there is an ESD load from PAD-ij to PAD-km (connection points or pads on different VCC or VSS buses). That means, for the known integrated semiconductor circuit, that the local ESD protective structures at PAD-ij and PAD-km are not in the discharge path and are therefore electrically not operative. The ESD discharge will therefore again take place through other active structures (gate oxides, pn diodes), which can thus be destroyed.

In the known ESD protective circuits with multiple supply voltage terminals of the integrated semiconductor circuit, there is accordingly the disadvantage that particularly in "crosswise" ESD loads between a connection point (PAD) and a non-local voltage supply, for instance between PAD1-n and VSS-2, the local ESD protective circuit will not be located in the discharge path. As a rule the ESD discharge current flows through parasitic substrate diodes (diffusion zones on the PAD with parasitic pn diodes to the substrate), which can thus become destroyed by heat. It should be taken into account in that respect that if supply potentials in the integrated semiconductor circuit are not connected in low-impedance fashion, then in the context of product release, ESD loads by the MIL standard to all of the supply pins (VSSi, VCCi) are prescribed.

One exemplary embodiment of an ESD protective circuit has the following layout, as shown in FIG. 2: a field oxide transistor FOX is connected between the first potential bus P1-i and a line LI, for instance carrying an input signal IN, and has a gate which is connected to the line LI. A point where the field oxide transistor FOX is connected to the line LI is designated x. A diffusion resistor $R_{dif}$ which is provided in the further course of the line LI, following the point x, has an end at which or shortly after which one terminal of a field-controlled diode ZVT is located. Another terminal of the field-controlled diode ZVT is also connected to the first potential bus P1-i.

This first terminal of the field-controlled diode ZVT forms a further point y of the line LI. It is assumed in this case that the field-controlled diode ZVT is constructed as a so-called zero volt transistor. In the zero volt transistor of FIG. 2, which functions as a field-controlled diode ZVT, a gate effecting the field control (like its source) is connected to the first potential bus P1-i. As usual, source and drain regions of the field oxide transistor FOX are constructed as diffusion zones (source region S, drain region D). One respective well-like region S-well and D-well is formed below each of the source region S and the drain region D. These well-like regions S-well, D-well are spaced apart from one another, as is shown in FIG. 3. They are of the same conduction type as the respective source and drain regions S, D.

FIGS. 2–5 show a preferred exemplary embodiment of the invention. In an integrated semiconductor circuit with a semiconductor substrate Sub, there are a number of first potential buses P1-1, P1-2, . . . , P1-i, which during operation carry a first supply potential VSS-1, VSS-2, . . . , VSS-i of the semiconductor circuit, and a number of second potential buses P2-1, P2-2, . . . , P2-i, which during operation carry a second supply potential VCC-1, VCC-2, . . . , VCC-i of the semiconductor circuit. A number of circuit portions S1, S2, S3, . . . , Si which are also formed on the semiconductor substrate, are each connected between one of the first and one of the second potential buses in order to be supplied with electrical voltage. In order to protect the circuit portions Si against overvoltages from an ESD load, protective circuits ESD-1, ESD-2, ESD-3, . . . , ESD-i are each disposed in a line path between a respective connection point PAD-11, PAD-1n, . . . , PAD-2j, PAD-ij and an associated circuit portion. Each protective circuit ESD-i has a discharge path EP, serving to dissipate overvoltages. The discharge paths EP are coupled to a potential bus bar P-ESD that carries a reference potential VESD during operation which is common with respect to all of the connection points PAD-ij of the circuit portions Si. In the illustrated embodiment, the potential bus bar P-ESD represents a common potential bar that is already formed on the semiconductor substrate (Sub) and which carries a potential VBB during operation of the semiconductor circuit that is common for all of the circuit portions, specifically, the potential ring for the substrate voltage VBB of the semiconductor circuit. In the case of a p-type semiconductor substrate, the substrate voltage or bulk voltage is the most-negative voltage in the chip. The value of the internal substrate voltage is −2.5 V, for instance.

According to the invention, it is now also possible to avoid the two types of critical ESD load cases described initially above.

In the first type of ESD load case, of a PAD to voltage supply, in the case where i≠k, the discharge always takes place over the defined path as follows: PAD-kj–ESD–VESD–diode–VCC-i or VSS-i. The ESD discharge current flows over the path of the protective structure: VESD-diode, so that the substrate diodes themselves are not loaded. In the case where i=k, the discharge again takes place by way of the defined path PAD-kj–ESD–VESD–diode–VCCi or VSSi, or in other words analogously to the situation where i≠k according to the invention.

In the second type of critical ESD load case, that is an ESD load from PAD to PAD, the discharge comparably takes place over the defined path of PAD-kj–ESD–VESD–ESD–PAD-km. In the case of i≠k, which in the previously known ESD protective structure has no protection against overvoltages, the discharge again takes place according to the invention over the defined path of PAD-ij–ESD–VESD–ESD–PAD-km.

In FIG. 5, a component indicated by reference symbol "A" in each case represents a so-called punch-through device according to the detailed illustration, which is connected to the respective connection point (PAD) and to the local potential bar VSS-i. A component "B" is an npn bipolar transistor according to the detailed illustration, which is connected to the respective connection point (PAD) and to the common potential bar (VBB). Moreover, as can be seen in FIG. 5, at least some of the "B" components may also be optionally connected between the local potential bar VSSi or VDDi and the common potential bar VBB, so that in that case there is complete symmetry with respect to ESD loads in terms of the local potential bars VCC-i–VCC-k, VSS-i–VSS-k, and/or VCC-i–VSS-k.

The diodes, which are indicated by reference symbols D1, D2, are np bipolar diodes and as shown in FIG. 5 are connected to the respective local potential bars VSS-i or VDD-i and to the common potential bar VBB.

Thus, in the integrated semiconductor circuit according to the invention, all of the ESD load cases are symmetrical with respect to an arbitrary supply potential, so that in particular crosswise ESD loads can be effectively avoided.

We claim:

1. An integrated semiconductor circuit, comprising:

a semiconductor substrate;

a number of first potential buses carrying a first supply potential of the semiconductor circuit during operation;

a number of second potential buses carrying a second supply potential of the semiconductor circuit during operation;

a number of circuit portions being formed on said semiconductor substrate and each being connected between a respective one of said first and a respective one of said second potential buses for being supplied with electrical voltage;

connection points being formed on said semiconductor substrate and each being assigned to a respective one of said circuit portions for receiving an input or output signal for said respective circuit portion during operation of said circuit portion;

protective circuits being formed on said semiconductor substrate and each being assigned to a respective one of said circuit portions for preventing overvoltage, said protective circuits each having an input side being connected to a respective one of said connection points and an output side being connected to said respective circuit portion; and a common potential bus bar carrying a reference potential being common with respect to all of said connection points during operation;

said protective circuits having discharge paths being coupled with said common potential bus bar for dissipating overvoltages.

2. The integrated semiconductor circuit according to claim 1, wherein said common potential bus bar is a common potential bar being formed on said semiconductor substrate and carrying a potential being common for all of said circuit portions during operation of the semiconductor circuit.

3. The integrated semiconductor circuit according to claim 1, wherein said common potential bus bar is a potential ring for a substrate voltage of the semiconductor circuit.

4. The integrated semiconductor circuit according to claim 1, including at least one pair of diode devices connecting said common potential bus bar to a respective one of said first potential buses and a respective one of said second potential buses.

5. The integrated semiconductor circuit according to claim 1, including lines each being coupled with a respective one of said connection points, said protective circuits each having a field oxide transistor being formed in said semiconductor substrate and having a gate terminal connected to a respective one of said lines.

6. The integrated semiconductor circuit according to claim 5, including field-controlled diodes each being connected downstream of a respective one of said field oxide transistors formed in said semiconductor substrate, said field-controlled diodes each having one terminal connected to a respective one of said lines and the another terminal connected to a respective one of said first potential buses.

7. The integrated semiconductor circuit according to claim 6, wherein said field-controlled diodes are zero volt transistors.

8. The integrated semiconductor circuit according to claim 6, wherein said field oxide transistors each have another terminal connected to said line, and including diffusion resistors each being connected to said line between a respective one of said field-controlled diodes and said terminals of a respective one of said field oxide transistors.

* * * * *